(12) United States Patent
Wood

(10) Patent No.: US 6,297,716 B1
(45) Date of Patent: Oct. 2, 2001

(54) Q-SWITCHED CAVITY MULTIPLIER

(75) Inventor: James Richard Wood, Grapevine, TX (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 09/464,880

(22) Filed: Dec. 16, 1999

(51) Int. Cl.$^7$ ............................... H01P 1/00; H03B 19/00
(52) U.S. Cl. .......................... 333/218; 327/116; 327/119; 327/123
(58) Field of Search .......................... 333/218; 327/119, 327/123, 116

(56) References Cited

U.S. PATENT DOCUMENTS

| | | | |
|---|---|---|---|
| 3,290,619 | 12/1966 | Geusic et al. | 359/245 |
| 3,379,956 | 4/1968 | Battles et al. | 333/218 |
| 3,631,331 | 12/1971 | Fairley et al. | 333/218 |
| 3,742,335 | 6/1973 | Konishi | 363/159 |
| 3,944,950 | 3/1976 | Jacobs et al. | 333/164 |
| 3,963,977 | 6/1976 | Mitsui | 363/159 |
| 4,342,008 * | 7/1982 | Jewett | 333/218 X |
| 4,527,137 | 7/1985 | Hartley | 333/137 |
| 4,595,892 | 6/1986 | Martinetti et al. | 333/218 |
| 4,636,758 | 1/1987 | Mettoudi | 333/218 |
| 4,712,121 | 12/1987 | Yokoyama | 357/4 |
| 4,782,222 | 11/1988 | Ragle et al. | 250/211 |
| 4,996,505 | 2/1991 | Keilmann | 333/218 |
| 5,278,427 | 1/1994 | Choi | 257/17 |
| 5,422,613 | 6/1995 | Nativ | 333/218 |
| 5,731,752 | 3/1998 | Wood | 333/218 |
| 5,796,314 | 8/1998 | Tantawi et al. | 333/20 |
| 5,880,921 | 3/1999 | Tham et al. | 361/233 |

OTHER PUBLICATIONS

"Application Notes for Bulk Window™ Waveguide Switch Elements", *M/A Com Semiconductor Products Operation*, Burlington, MA 01803, pp. 3–3 through 3–8, 1990. (No month).*

Stephan Ohr, "Darpa Sows Seeds of a Telecom Revolution," *EE Times*, Aug. 4, 1997, p. 1.

F.M. Mueller, et al, "HTS Microwave Cavity with Temperature–Independent Frequencies," *IEEE Transactions on Applied Superconductivity*, vol. 5, No. 2, Jun. 1995, pp 1983–1986.

C.J. Maggiore, et al, "Low–loss Microwave Cavity Using Layered–dielectric Materials," *Appl. Phys. Lett* 64 (11) Mar. 14, 1994, pp. 1451–1453.

(List continued on next page.)

*Primary Examiner*—Robert Pascal
*Assistant Examiner*—Barbara Summons
(74) *Attorney, Agent, or Firm*—Sidley Austin Brown & Wood; Stephen S. Sadacca

(57) ABSTRACT

A switched frequency multiplier receives pulses of pump energy as an input signal. The input signal is transferred to within a housing having a first cavity tuned to the frequency of the pump signal and a second cavity which is tuned to a harmonic of the input signal and is enclosed within the first cavity. An outlet port couples the second tuned cavity to a waveguide which includes a Q-switch that can be turned on and off. The interior of the housing has a planar grid of layers which includes a layer of nonlinear material and a frequency selective layer. The frequency selective layer is transparent to the input signal but reflective to the harmonic output signal thereby trapping energy in the second cavity. The multiplier operates by receiving a pump pulse and storing the energy while the Q-switch is closed. When the Q-switch is opened near the end of the pump pulse, the stored energy is suddenly released to produce a relatively high energy harmonic pulse having a shorter duration than the pump pulse.

24 Claims, 3 Drawing Sheets

OTHER PUBLICATIONS

E. Yablonovitch, "Photonic Band–gap Structures," Journal of the Optical Society of America Bulletin, vol. 10, No. 2, Feb. 1993, pp 283–295.

Henry O. Everitt, "Applications of Photonic Band Gap Structures," *Optics and Photonics News*, Nov. 1992, pp 20–23.

N.C. Luhmann, Jr., High Power, High Efficiency, Monolithic Quasi–Optical Frequency Triplers Using Microwave Power Module Drivers, Feb. 27, 1996.

Joy Yi–Yin Liao, "Frequency Multipliers for Millimeter Wave Applications," Riken Review, No. 11, Dec. 1995, pp5–6.

J. Grenzer, et al, "Frequency Multiplication of Microwave Radiation in a Semiconductor Superlattice by Electrons Capable to Perform Bloch Oscillations," Annalen der Physik, Apr. 1995, pp 265–271.

K.N. Ostricov, et al, "Resonant Second Harmonics Generation of the Submillimeter Surface Wave in the Semiconductor Superlattice Bounded by a Metal," IEEE Antennas and Propagation Society Int'l Symposium, 1995 Digest, vol. I, pp 742–745, Jun., 1995.

D. Lippens, "Quantum Well Devices for Millimetre Wave Applications," *23$^{rd}$ European Microwave Conference*, Madrid, Spain, Sep. 1993, pp 61–66.

M. Hadjazi, et al "60 GHz Reflection Gain Based on Superlattice Negative Differential Conductance," *Electronics Letters*, Apr. 15, 1993, vol. 29, No. 8, pp 648–649.

Wen–Shiung Lour, "Multi–state Superlattice–Emitter Resonant–Tunneling Bipolar Transistor with Circuit Applications," *Superlattices and Microstructures*, 1993, Academic Press Ltd., pp 81–86, received Aug. 1992.

Federico Capasso, "Quantum Effect Devices: Physics and Applications," edited by Anastassakis & Joannopoulos, 20$^{th}$ International Conference on The Physics of Semiconductor, Aug. 1990, pp 379–386.

A.Y. Cho, "Current State and Future Challenge in Molecular Beam Epitaxy (MBE) Research," Molecular Beam Epitaxy 1988, Sapporo, Japan, Reprinted from *Journal of Crystal Growth*, 95 (1989) Nos. 104, pp 1–10, Aug., 1988.

Tohru Takada et al, "Frequency Triplers and Quadruplers with GaAs Schottky–Barrier Diodes at 450 and 600 GHz," IEEE Transactions on Microwave Theory and Techniques, vol. MTT–27, No. 5, May 1979, pp 519–523.

L.A. Blackwell et al., "Semiconductor–Diode Parametric Amplifiers," Prentice–Hall Inc., 1961, pp 57–60 and 101–121.

\* cited by examiner

Q-SWITCHED CAVITY MULTIPLIER

TECHNICAL FIELD OF THE INVENTION

The present invention pertains in general to devices for multiplying the frequency of microwave signals and in particular to such devices, which have a plurality of different resonant cavities.

BACKGROUND OF THE INVENTION

Certain applications utilizing microwave signals require the production of a very high frequency signal in the microwave range. In general, the efficiency of producing a high frequency signal becomes less as the frequency of the signal increases. Therefore, the use of a frequency multiplier device with relatively high conversion efficiency can be a practical approach to the production of high frequency microwave signals. One type of microwave frequency multipliers is described in a white paper proposal entitled "High Power, High Efficiency, Monolithic Quasi-Optical Frequency Triplers Using Microwave Power Module Drivers" by N. C. Luhman, Jr. dated Feb. 27, 1996. The frequency multiplier described in this paper is an elongate waveguide device, which includes input and output filters and a multiplier array comprising diodes with antenna leads. A cavity multiplier, which does not utilize switching, is described in U.S. Pat. No. 5,731,752 entitled "Microwave Signal Frequency Multiplier."

There exists a need for a switched, microwave frequency multiplier, which can store energy at a frequency which is a multiple of a source signal and selectively release this energy when required.

SUMMARY OF THE INVENTION

A selected embodiment of the present invention is a switched microwave frequency signal multiplier, which includes a pump signal cavity for receiving a pump signal via an input port. A nonlinear medium is positioned within the pump signal cavity for receiving the pump signal and producing therefrom a harmonic signal of the pump signal. A frequency selective barrier is positioned within the pump signal cavity for defining a harmonic signal cavity for storing therein energy at the harmonic signal frequency. The frequency selective barrier is substantially transparent to the pump signal and substantially reflective to the harmonic signal. An output port is coupled to the harmonic signal cavity. A two-state switch is positioned in series with the output port. When the switch is set to a first state it blocks the transfer of the stored energy from the harmonic signal cavity. When set to the second state, the switch releases the stored energy from the harmonic signal cavity through the output port to produce a microwave signal pulse.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION

Figure 1:
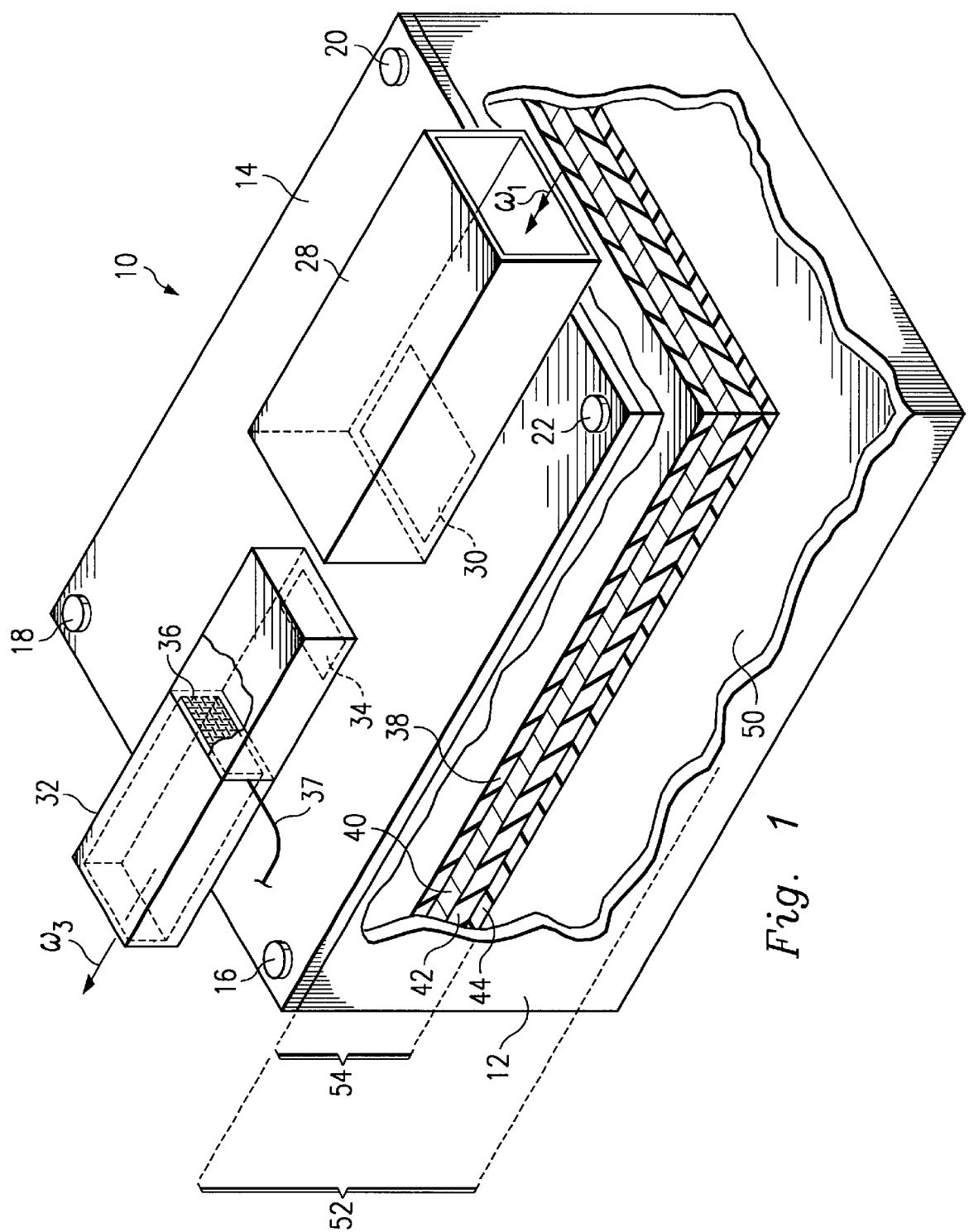
FIG. 1 is a perspective, partially cut-away view of a Q-switched frequency multiplier in accordance with the present invention.

A frequency multiplier 10 in accordance with the present invention is illustrated in FIG. 1. The multiplier 10 receives an input signal $\omega_1$, which is also referred to as a pump signal. Within the multiplier 10, the input signal $\omega_1$ is multiplied to produce an output signal $\omega_3$, which may be, for example, three times the frequency of the input signal. The multiplier 10 includes a switch which causes a build-up of energy from the input signal and selectively releases this energy as the multiplied output signal $\omega_3$.

The multiplier 10 includes a lower housing 12 and a top plate 14 which is secured to the housing 12 by means of screws 16, 18, 20, and 22. The housing 12 and plate 14 are preferably made of brass, aluminum or a plated dielectric material. The input signal $\omega_3$, is provided to the multiplier 10 through an input waveguide 28, which is secured to the top plate 14. The input microwave signal $\omega_1$ is transferred through an opening 30 in the plate 14 to the interior of the housing 12. The multiplier 10 includes an output waveguide 32, which is mounted on the plate 14 and receives microwave signal energy via an opening 34 in the plate 14. The dimensions of each waveguide are principally determined by the frequency of the primary signal carried by the waveguide. The input and output waveguides may also be referred to as input and output ports.

A Q-switch 36 is mounted within the waveguide 32 and functions to either block or pass the output signal $\omega_3$. The Q-switch 36 receives a control signal via the line 37 to turn the switch 36 on and off. Within the housing 12 there is provided a grid structure comprising a plurality of layers of materials. At the top of the grid there is provided a nonlinear layer 38. Immediately below the nonlinear layer 38 there are provided temperature compensation dielectric layers 40 and 42. Immediately below the layer 42 there is provided a frequency selective layer 44.

The dimensions and relative sizes shown in FIG. 1 are for illustrative purposes and do not necessarily represent actual dimensions or size relationships. Actual dimensions are primarily a function of the selected operating frequencies.

The interior of the housing 12 has a surface 50 which is reflective to the microwave energy present within the multiplier 10. The region within the housing 12 between the lower surface of the plate 14 and the surface 50 comprises a pump signal cavity 52 which is tuned to the frequency of the input signal $\omega_1$. The region within the housing 12 between the lower surface of the plate 14 and the frequency selective layer 44 comprises a harmonic signal cavity 54 which is tuned to the frequency of the output signal $\omega_3$ which is a harmonic of the input signal $\omega_1$. The signal $\omega_3$ is preferably the third harmonic of the signal $\omega_1$, that is, $\omega_3$ has three times the frequency of $\omega_1$.

The Q-switch 36 can be fabricated as any one of the following:

(A) PIN diode switch, as described in Application Notes for Bulk Window™ waveguide switch elements, pages 3-3 through 3-8, M/A Com Semiconductor Products Operation, Burlington, Mass. 01803.

(B) Micro-Electro-Mechanical Switches (MEMS) as described in U.S. Pat. No. 5,880,921 by Tham, et al. which issued Mar. 9, 1999 and is ent "Monolithically Integrated Switched Capacitor Bank Using Micro Electro Mechanical System (MEMS) Technology." A further description of this type of switch is given in an article "DARPA Sows Seeds of a Telecom Revolution," EE Times, Monday, Aug. 4, 1997, starting on page 1.

(C) Laser diode switched photoconductive materials/window as described in U.S. Pat. No. 5,796,314 to Tantawi, et al. entitled "Active High-Power RF Switch And Pulse Compression System."

(D) Bulk avalanche semiconductor switch (BASS) as described in U.S. Pat. No. 4,782,222 to Ragle, et al. entitled "Bulk Avalanche Semiconductor Switch Using Partial Light Penetration And Inducing Field Compression."

(E) A latching circulator such as Model OP320 sold by Channel Microwave Corporation, 480 Constitution Avenue, Camarillo, Calif. 93012.

The nonlinear material layer 38 is preferably a doped superlattice, which comprises a photonic band gap structure. Such structures are described in "Photonic Band-Gap Structures" by E. Yablonovitch in *Journal of the Optical Society of America Bulletin*, Volume 10, No. 2, Febuary 1993, pp. 283–295. As described in the article, the dimensions of the material are a function of the operating frequency. An applicable photonic band gap structure is further described in "Applications of Photonic Band Gap Structures" by Henry O. Everitt in *Optics and Photonics News*, November 1992, pp. 20–23.

The temperature compensation dielectric layers 40 and 42 are preferably dielectric layers chosen for their dielectric property behavior over frequency and thickness, so as to achieve a given level of volume fill to achieve temperature compensated device operation. This technique is described in HTS Microwave Cavity with Temperature Independent Frequencies-Mueller, et al. in IEEE Transactions on Applied Superconductivity, Vol. 5, No. 2, June 1995, pp. 1983–1986.

The temperature compensation dielectric layers may exist separately from, or form part or all of the frequency selective layer 44.

The frequency selective layer is preferably fabricated as described in "Low-Loss Microwave Cavity Using Layered-Dielectric Materials" by C. J. Maggiore, et al. in *Appl. Phys. Lett.* 64(11), Mar. 14, 1994, starting at p. 1451. The arrangement of dielectric materials described in this paper is a superlattice.

The multiplier 10 is shown in FIG. 1 with a rectangular configuration, which in a selected embodiment can have a length dimension of approximately one (1) inch and a thickness of approximately 0.25 inch. However, it can have other shapes, such as rectangular or round, with the size primarily depending upon the necessary sizes required for the tuned cavities 52 and 54.

The embodiment shown in FIG. 1 uses microwave waveguides but can also utilize other microwave conductors such as microstrip and coaxial lines.

In operation, the switch 36 is placed in a first state to block the release of energy from the multiplier 10 while input energy in the form of signal $\omega_1$ is received. This energy is transferred to the cavity 52, but as the input signal passes through the nonlinear layer 38, a harmonic signal having components, including a third harmonic, is produced, and this harmonic is at the frequency of the desired output signal $\omega_3$. The frequency selective layer 44 is transparent to the input signal $\omega_1$, the lower microwave frequency, but is reflective to the harmonic microwave signal $\omega_3$, which is at a substantially higher microwave frequency. Thus, the signal at the frequency of $\omega_3$ is trapped within the smaller cavity 54, but the input signal $\omega_1$ is present within a larger cavity 52. The lower frequency signal within the cavity 52 is converted into the higher frequency signal $\omega_3$ and trapped within the cavity 54.

When the Q-switch 36 is switched to its second state and becomes transparent to the signal $\omega_3$, the energy within the cavity 54 is transferred through the opening 34, the switch 36, and out through the waveguide 32 as signal $\omega_3$. In blocking the output signal by use of the switch 36, energy from the input signal $\omega_1$ can be stored as high frequency energy $\omega_3$, to produce a high-energy pulse upon opening the switch 36.

Figure 2:
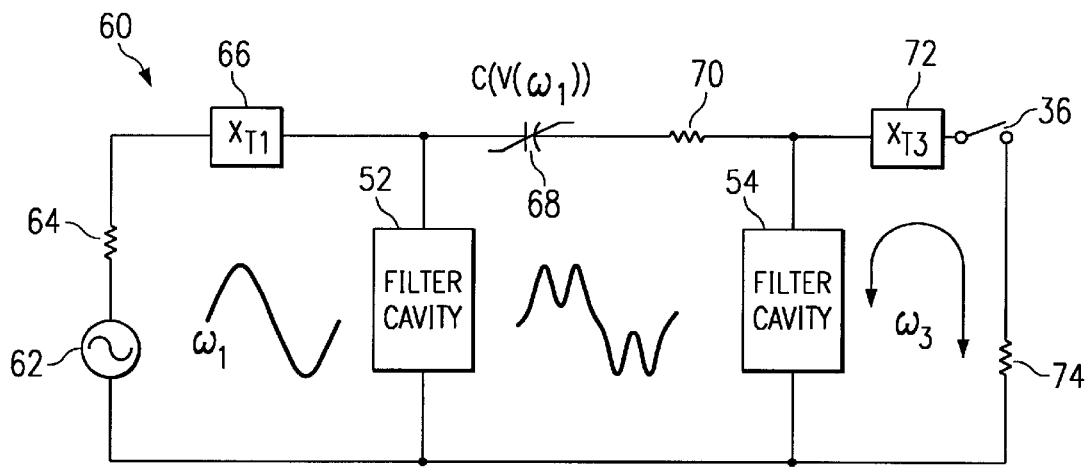
FIG. 2 is an schematic diagram of the multiplier shown in FIG. 1.

An electrical schematic circuit 60 is shown in FIG. 2 for illustrating the operation of the multiplier 10 shown in FIG. 1. Elements that are common to FIG. 1 and FIG. 2 carry the same reference numeral. A source 62 indicates a generator for the input signal $\omega_1$. A resistor 64 represents the loss of the source and the loss in the input waveguide. An impedance 66 represents a matching section between the input signal source and the first filter cavity 52.

A variable capacitor 68 represents the nonlinear layer 38. A resistor 70 represents losses in the nonlinear layer 38. An impedance 72 represents a matching section between the output cavity 54 and the Q-switch 36. Resistor 74 represents the desired load of output waveguide 32. The cavities 52 and 54 shown in FIG. 2 correspond to the similarly numbered cavities shown in FIG. 1. The switch 36 shown in FIG. 2 corresponds to the Q-switch 36 shown in FIG. 1.

The operation of the multiplier 10 as represented by the schematic circuit 60 is as follows. The pump source signal $\omega_1$ is introduced to filter cavity 52, which encompasses nonlinear layer 38. Cavity 54 is nested within filter cavity 52 and also encompasses nonlinear layer 38. Due to the action of the input pump source signal $\omega_1$ on nonlinear layer 38, harmonic signals are generated that resonate in filter cavity 54. Switch 36, while in a closed condition, provides a highly reflective condition to the signal $\omega_3$ in cavity 54. Due to the high Q value of cavity 54, the signal $\omega_3$ builds up increasing energy during the pump pulse of signal $\omega_1$. After a suitable energy level has built up in cavity 54, a signal is sent to switch 36 to place it in an on condition, which causes the energy of cavity 54 to be suddenly released. The Q of cavity 54 is much reduced with the switch 36 in the on position. The stored energy is able to rapidly exit the Q cavity 54, which enables a well-defined short pulse to be transmitted into output load 74. This is shown in FIG. 4A.

Figure 3:
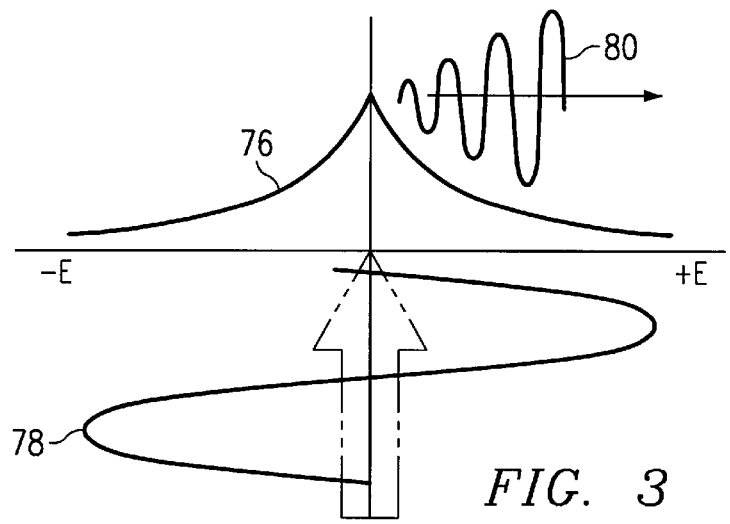
FIG. 3 is a chart illustrating the signal production of the multiplier shown in FIG. 1, FIGS. 4A and 4B are waveform charts illustrating the pump pulse and resulting multiple frequency pulse with and without a Q-switch.

FIG. 3 is an illustration of the transfer function provided by the varying dielectric value, shown by curve 76, of the nonlinear layer 38 which is acted on by input signal $\omega_1$ (78), and generates an increasing amplitude energy signal $\omega_3$ (80). Signal 80 is a harmonic of signal 78.

Figure 4A:
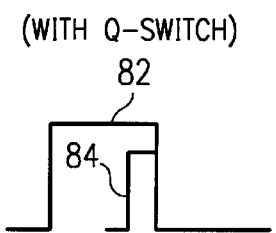
Figure 4B:
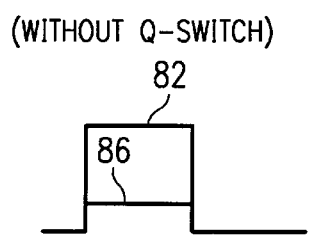

FIGS. 4A and 4B show input and output pulses of the signals $\omega_1$ and $\omega_3$. FIG. 4A shows input pump pulse 82 of signal $\omega_1$ and output pulse 84 of signal $\omega_3$ for the multiplier 10 shown in FIG. 1, which includes the Q-switch 36. The Q-switch 36 is closed when the pulse 82 begins. The Q-switch 36 is opened to start the generation of the pulse 84. The switch 36 is closed at the end of the pump pulse or at a later time, but in any case before the next pump pulse begins.

FIG. 4B illustrates what an output pulse $\omega_3$ (86) would be in response to input pump pulse $\omega_1$ (82) should the multiplier 10 not include the Q-switch 36. In such a case, the input and output pulses are essentially the same duration, but the peak power of the output pulse is much less.

As shown in FIG. 4A, the output signal pulse is produced near the end of the pump pulse at a much larger energy level than would have been available had no Q switch operation been performed to store energy. This is illustrated by a flat top output pulse 86, which represents the output pulse without Q switching, which pulse lasts as long as the input pulse, and a higher level output pulse 84, which exists only near the end of the pump pulse 82.

Figure 5:
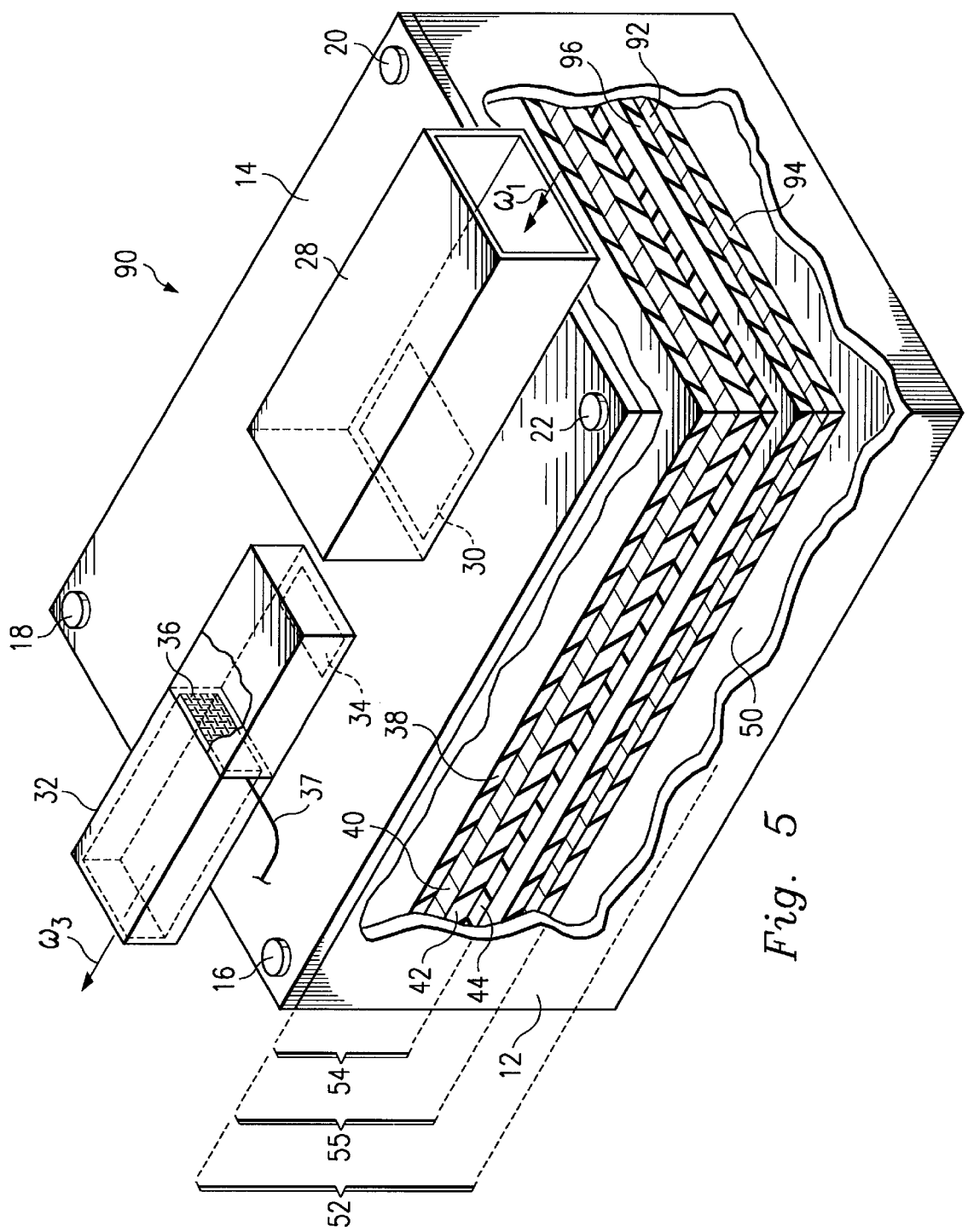
FIG. 5 is a second embodiment of the invention having an intermediate energy storage stage.

FIG. 5 illustrates a multiplier 90 in accordance with a further aspect of the present invention. The elements of multiplier 90 that are the same as those for the multiplier 10 shown in FIG. 1 have corresponding reference numerals. An additional cavity 55 is added to FIG. 5 representing an idler cavity. This enables the multiplier to provide additional frequency outputs by adding frequency terms for the pump harmonics. The idler cavity 55 can be nested within the input pump cavity as shown in FIG. 5, enclosing the nonlinear layer, as well as the desired output cavity 54.

The multiplier 90 includes a second group of layers 96, 92, and 94 which are offset by a gap below the layers 38, 40, 42, and 44. The layers 96 and 92 are temperature compensation dielectric layers corresponding to the previously described dielectric layers 40 and 42. The layer 94 is a frequency selective layer that corresponds to frequency selective layer 44. However, layer 94 has a different cut-off frequency. The frequency selective layer 94 is transparent to the input signal $\omega_1$, but is reflective for an intermediate frequency $\omega_2$, which is at a greater frequency than $\omega_1$, but a lesser frequency than $\omega_3$. For example, the signal $\omega_3$ can be three times the frequency of signal $\omega_1$, and signal $\omega_2$ can be twice the frequency of signal $\omega_1$.

U.S. Pat. No. 5,731,752 entitled "Microwave Signal Frequency Multiplier" which issued Mar. 24, 1998 is incorporated by reference herein. The structures shown in this patent may be utilized as a part of the present invention.

Although several embodiments of the invention have been illustrated in the accompanying drawings and described in the foregoing Detailed Description, it will be understood that the invention is not limited to the embodiments disclosed, but is capable of numerous rearrangements, modifications and substitutions without departing from the scope of the invention.

What is claimed is:

1. A switched microwave frequency signal multiplier comprising:
    a pump signal cavity for receiving a pump signal via an input port,
    a nonlinear medium within said pump signal cavity for receiving said pump signal and producing therefrom a harmonic signal of said pump signal,
    a frequency selective barrier positioned within said pump signal cavity for defining a harmonic signal cavity for storing therein energy at said harmonic signal frequency, said frequency selective barrier substantially transparent to said pump signal and substantially reflective to said harmonic signal,
    an output port coupled to said harmonic signal cavity, and
    a two-state switch positioned in series with said output port, wherein said switch has a first state for blocking transfer of said stored energy from said harmonic signal cavity and having a second state to permit release of said stored energy from said harmonic signal cavity through said output port.

2. A switched microwave frequency signal multiplier as recited in claim 1 wherein said input port and said output port are waveguides.

3. A switched microwave frequency signal multiplier as recited in claim 2 wherein said waveguides are positioned on a common surface of said multiplier.

4. A switched microwave frequency signal multiplier as recited in claim 1 wherein said output port is a waveguide and said switch is positioned in said waveguide.

5. A switched microwave frequency signal multiplier as recited in claim 1 wherein said nonlinear medium and said frequency selective barrier are coplanar layers.

6. A switched microwave frequency signal multiplier as recited in claim 1 wherein said nonlinear medium and said frequency selective barrier are coplanar layers on opposite sides of at least one temperature compensation layer.

7. A switched microwave frequency signal multiplier as recited in claim 1 wherein said nonlinear medium and said frequency selective barrier are included in an integral grid with at least one temperature compensation component therein.

8. A switched microwave frequency signal multiplier as recited in claim 1 wherein said harmonic signal has three times the frequency of said pump signal.

9. A switched microwave frequency signal multiplier, comprising:
    a housing,
    an input waveguide mounted to said housing and in communication with a first opening in said housing to the interior of said housing,
    an output waveguide mounted to said housing and in communication with a second opening in said housing to the interior of said housing,
    a microwave switch mounted in said output waveguide, said switch having an open state and a closed state, wherein said switch causes input signal energy received through said input waveguide to be stored in said housing when said switch is closed and said switch releases said stored energy through said output waveguide when said switch is opened,
    a nonlinear member mounted within said housing and functioning to produce at least one harmonic signal of said input signal which is directed to said nonlinear member, and
    a frequency selective member mounted within said housing for substantially transmitting therethrough said input signal and substantially reflecting said harmonic signal, wherein said frequency selective member divides the interior of said housing into an input signal tuned cavity and a harmonic signal tuned cavity.

10. A switched microwave frequency signal multiplier as recited in claim 9 wherein said waveguides are positioned on a common surface of said housing.

11. A switched microwave frequency signal multiplier as recited in claim 9 wherein said nonlinear medium and said frequency selective barrier are coplanar layers.

12. A switched microwave frequency signal multiplier as recited in claim 9 wherein said nonlinear medium and said frequency selective barrier are coplanar layers on opposite sides of at least one temperature compensation layer.

13. A switched microwave frequency signal multiplier as recited in claim 9 wherein said nonlinear medium and said frequency selective barrier are included in an integral grid with at least one temperature compensation component therein.

14. A switched microwave frequency signal multiplier as recited in claim 9 wherein said one harmonic signal has a frequency three times that of said input microwave signal.

15. A switched microwave frequency signal multiplier, comprising:
    a pump signal cavity for receiving a pump signal via an input port, a nonlinear medium within said pump signal cavity for receiving said pump signal and producing therefrom at least first and second harmonic signals of said pump signal, a first frequency selective barrier positioned within said pump signal cavity for defining a first harmonic signal cavity for storing therein energy at said first harmonic signal frequency, said first frequency selective barrier substantially transparent to said pump signal and substantially reflective to said first harmonic signal, a second frequency selective barrier positioned within said pump signal cavity for defining a second harmonic signal cavity for storing energy therein at said second harmonic signal frequency, said second frequency selective barrier substantially transparent to said pump signal and substantially reflective to said second harmonic signal, an output port coupled to said first harmonic signal cavity, and a two state switch positioned in series with said output port, wherein said switch has a first state for blocking transfer of said stored energy from said harmonic signal cavities and has a second state to release said stored energy from said harmonic signal cavities through said output port.

16. A switched microwave frequency signal multiplier as recited in claim 15 wherein said waveguides are positioned on a common surface of said housing.

17. A switched microwave frequency signal multiplier as recited in claim 15 wherein said nonlinear medium and said frequency selective barriers are coplanar layers.

18. A switched microwave frequency signal multiplier as recited in claim 15 wherein said nonlinear medium and said first frequency selective barrier are coplanar layers on opposite sides of at least one temperature compensation layer.

19. A switched microwave frequency signal multiplier as recited in claim 15 wherein said nonlinear medium and said first frequency selective barrier are included in a first integral grid with at least one temperature compensation component therein and said second frequency selective barrier is included in a second integral grid with at least one temperature compensation component therein.

20. A switched microwave frequency signal multiplier as recited in claim 19 wherein said first and second grids are separated by a gap.

21. A switched microwave frequency signal multiplier as recited in claim 19 wherein said first harmonic signal has a frequency three times that of said input microwave signal.

22. A method for producing a pulsed microwave signal, comprising the steps of:

transmitting a pump signal, which comprises a sequence of pulses, into a pump signal cavity, applying said pump signal to a nonlinear medium to produce a harmonic signal of said pump signal, applying said pump signal and said harmonic signal to a frequency selective barrier which is substantially transparent to said pump signal and substantially reflective to said harmonic signal, wherein said barrier establishes a portion of said pump signal cavity as a harmonic signal cavity, setting a microwave switch, which is positioned in series with an output port from said harmonic signal cavity, to a first state to block transfer of said harmonic signal from said harmonic signal cavity to cause energy at said harmonic signal frequency to be stored in said harmonic signal cavity during at least a portion of the period of a pulse of said pump signal, and setting said microwave switch to a second state to release said stored energy from said harmonic signal cavity to produce a output pulse at the frequency of said harmonic signal, wherein the duration of said output pulse is less than the duration of said pump signal pulse.

23. A method for producing a pulsed microwave signal as recited in claim 22 including the step of setting said microwave switch to said first state at approximately the same time as the end of said pump signal pulse.

24. A method for producing a pulsed microwave signal as recited in claim 22 wherein said harmonic signal has three times the frequency of said pump signal.

* * * * *